(12) United States Patent
Bhattacharjee

(10) Patent No.: US 8,529,986 B1
(45) Date of Patent: Sep. 10, 2013

(54) LAYER ACOUSTIC WAVE DEVICE AND METHOD OF MAKING THE SAME

(75) Inventor: Kushal Bhattacharjee, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1424 days.

(21) Appl. No.: 12/031,885

(22) Filed: Feb. 15, 2008

Related U.S. Application Data

(62) Division of application No. 11/418,909, filed on May 5, 2006, now Pat. No. 7,619,347.

(60) Provisional application No. 60/684,015, filed on May 24, 2005, provisional application No. 60/687,822, filed on Jun. 6, 2005.

(51) Int. Cl.
    *H04R 17/00* (2006.01)
(52) U.S. Cl.
    USPC .................................. 427/100; 310/313 R
(58) Field of Classification Search
    USPC ............. 427/100; 310/313 R, 313 A, 313 B, 310/313 C, 313 D
    See application file for complete search history.

(56) References Cited

U.S. PATENT DOCUMENTS

| | | | |
|---|---|---|---|
| 3,585,415 A | 6/1971 | Muller et al. | |
| 4,464,639 A | 8/1984 | Staples | |
| 4,898,604 A | 2/1990 | Sauerwein | |
| 5,010,269 A | 4/1991 | Hikita et al. | |
| 5,338,999 A | 8/1994 | Ramakrishnan et al. | |
| 5,446,330 A | 8/1995 | Eda et al. | |
| 5,448,126 A | 9/1995 | Eda et al. | |
| 5,453,652 A | 9/1995 | Eda et al. | |
| 5,682,126 A | 10/1997 | Plesski et al. | |
| 5,815,900 A | 10/1998 | Ichikawa et al. | |
| 5,846,320 A | 12/1998 | Matsuyama et al. | |
| 5,846,415 A | 12/1998 | Tsuchida et al. | |
| 6,034,578 A | 3/2000 | Fujita et al. | |
| 6,313,568 B1 | 11/2001 | Sullivan et al. | |
| 6,353,372 B1 | 3/2002 | Baier et al. | |
| 6,420,820 B1 | 7/2002 | Larson, III | |
| 6,420,946 B1 | 7/2002 | Bauer et al. | |

(Continued)

FOREIGN PATENT DOCUMENTS

| | | |
|---|---|---|
| JP | 02000932 A | 1/1990 |
| JP | 7086866 A | 3/1995 |

(Continued)

OTHER PUBLICATIONS

"US data for solids" (no date available).*

(Continued)

*Primary Examiner* — Michael Cleveland
*Assistant Examiner* — Tabassom Tadayyon Eslami
(74) *Attorney, Agent, or Firm* — Withrow & Terranova, P.L.L.C.

(57) ABSTRACT

The present invention provides a layer acoustic wave device that is formed without requiring a bonding process to attach a secondary substrate. In particular, the layer acoustic wave device is formed from a substrate, an interdigital transducer created on the substrate, a dielectric layer formed over the interdigital transducer and substrate, and at least one isolation layer formed over the dielectric layer. The at least one isolation layer has sufficient properties to minimize particle displacement on a top surface of the at least one isolation layer. The at least one isolation layer has a greater acoustic impedance than that of the dielectric layer.

15 Claims, 4 Drawing Sheets

(56) References Cited

U.S. PATENT DOCUMENTS

| | | | |
|---|---|---|---|
| 6,441,539 | B1 | 8/2002 | Kitamura et al. |
| 6,573,635 | B2 | 6/2003 | Suga et al. |
| 6,599,781 | B1 | 7/2003 | Li |
| 6,685,168 | B1 | 2/2004 | Stelzl et al. |
| 6,737,941 | B1 | 5/2004 | Tournois |
| 6,754,471 | B1 | 6/2004 | Vakilian |
| 6,759,928 | B2 | 7/2004 | Endou et al. |
| 6,801,100 | B2 | 10/2004 | Nakamura et al. |
| 6,815,035 | B2 | 11/2004 | Bennett et al. |
| 6,816,035 | B2 | 11/2004 | Ma et al. |
| 6,853,113 | B2 | 2/2005 | Bergmann |
| 6,861,927 | B1 | 3/2005 | Abbott et al. |
| 7,019,435 | B2 | 3/2006 | Nakaya et al. |
| 7,042,313 | B2 | 5/2006 | Yata |
| 7,071,796 | B2 | 7/2006 | Ueda et al. |
| 7,078,989 | B2 | 7/2006 | Inoue et al. |
| 7,101,721 | B2 | 9/2006 | Jorgenson et al. |
| 7,112,912 | B2 | 9/2006 | Inoue et al. |
| 7,126,259 | B2 | 10/2006 | Moler et al. |
| 7,304,553 | B2 | 12/2007 | Bauer et al. |
| 7,358,831 | B2 | 4/2008 | Larson, III et al. |
| 7,528,684 | B1 | 5/2009 | Rao et al. |
| 2003/0155844 | A1* | 8/2003 | Anasako ............... 310/364 |
| 2004/0104791 | A1 | 6/2004 | Satoh et al. |
| 2004/0164650 | A1 | 8/2004 | Xu et al. |
| 2004/0256624 | A1 | 12/2004 | Sung |
| 2005/0057323 | A1 | 3/2005 | Kando |
| 2005/0099091 | A1 | 5/2005 | Mishima et al. |
| 2006/0138902 | A1* | 6/2006 | Kando ............... 310/313 D |
| 2006/0186556 | A1 | 8/2006 | Sung |
| 2007/0109075 | A1 | 5/2007 | Igaki |
| 2007/0296306 | A1 | 12/2007 | Hauser et al. |

FOREIGN PATENT DOCUMENTS

| | | | |
|---|---|---|---|
| JP | 2005347295 | A | 12/2005 |
| JP | 2006222512 | A | 8/2006 |
| WO | WO/2005/069486 | * | 7/2005 |
| WO | 2005013481 | A1 | 10/2005 |
| WO | 2006032335 | A1 | 3/2006 |

OTHER PUBLICATIONS http://www.bamr.co.za/velocity%20of%20materials.shtml.* http://www.bamr.co.za/velocity%20of%20materials.shtm (No Date Available) "US Data for Solids" (No date available).*

Doberstein, S.A. et al., "Balanced Front-End Hybrid Saw Modules with Impedance Conversion," 2002 IEEE Ultrasonics Symposium Proceedings, 2002, 123-126, vol. 1, IEEE.

Nakamura, Hiroyuki et al., "A Design Technique of Balanced Longitudinal Coupled Mode Saw Filters for RF-stage with a Desired Matching Impendance," 2003 IEEE Ultrasonics Symposium Proceedings, 2003, 2097-2100, IEEE.

Norita, Takao et al., "Wideband Low Loss Double Mode Saw Filters," 1992 IEEE Ultrasonics Symposium Proceedings, 1992, 95-104, IEEE.

International Search Report for PCT/US2008/050627 mailed May 30, 2008.

Requirement for Restriction/Election mailed Jan. 15, 2008 regarding U.S. Appl. No. 11/431,988 now U.S. Patent No. 7,408,284.

Notice of Allowance mailed Apr. 9, 2008 regarding U.S. Appl. No. 11/431,988 now U.S. Patent No. 7,408,284.

Requirement for Restriction/Election mailed Dec. 8, 2010 regarding U.S. Appl. No. 12/030,666.

Ex parte Quayle Action mailed Mar. 16, 2011 regarding U.S. Appl. No. 12/030,666.

Requirement for Restriction/Election mailed Jan. 15, 2008 regarding U.S. Appl. No. 11/431,986 now U.S. Patent No. 7,449,813.

Nonfinal OA mailed Apr. 7, 2008 regarding U.S. Appl. No. 11/431,986 now U.S. Patent No. 7,449,813.

Notice of Allowance mailed Jul. 18, 2008 regarding U.S. Appl. No. 11/431,986 now U.S. Patent No. 7,449,813.

Nonfinal OA mailed Oct. 22, 2010 regarding U.S. Appl. No. 12/030,711.

Notice of Allowance mailed Dec. 22, 2010 regarding U.S. Appl. No. 12/030,711.

Final Office Action mailed Jan. 20, 2011 regarding U.S. Appl. No. 11/969,956.

Nonfinal OA mailed Jun. 5, 2008 regarding U.S. Appl. No. 11/432,249 now U.S. Patent No. 7,528,684.

Notice of Allowance mailed Dec. 30, 2008 regarding U.S. Appl. No. 11/432,249 now U.S. Patent No. 7,528,684.

Requirement for Restriction/Election mailed Jan. 14, 2008 regarding U.S. Appl. No. 11/431,991 now U.S. Patent No. 7,521,837.

Nonfinal OA mailed Apr. 4, 2008 regarding U.S. Appl. No. 11/431,991 now U.S. Patent No. 7,521,837.

Final Office Action mailed Aug. 21, 2008 regarding U.S. Appl. No. 11/431,991 now U.S. Patent No. 7,521,837.

Notice of Allowance mailed Dec. 16, 2008 regarding U.S. Appl. No. 11/431,991 now U.S. Patent No. 7,521,837.

Nonfinal OA mailed Feb. 19, 2010 regarding U.S. Appl. No. 12/030,735 now U.S. Patent No. 7,849,582.

Notice of Allowance mailed Aug. 6, 2010 regarding U.S. Appl. No. 12/030,735 now U.S. Patent No. 7,849,582.

Hajime Kando et al., "RF Filter Using Boundary Acoustic Wave," Japanese Journal of Applied Physics, 2006, pp. 4651-4654, vol. 45, No. 5B, The Japan Society of Applied Physics.

C.C.W. Ruppel et al., "Surface Acoustic Wave Devices for Wireless Local Area Networks," International Symposium on Acoustic Wave Devices for Future Mobile Communication Systems, Mar. 2001, Chiba University.

Masatsune Yamaguchi et al., "Highly Piezoelectric Boundary Waves in Si/SiO2/LiNbO3 Structure," 1998 IEEE International Frequency Control Symposium, 1998, pp. 484-488, IEEE.

Sato, H. "Temperature Stable Saw Devices Using Directly Bonded LiTaO3/Glass Substrates," IEEE Ultrasonics Symposium, 1998, pp. 335-339, vol. 1, IEEE.

McKeown, S.A., Mechanical Analysis of Electronic Packaging Systems, 1999, pp. 130-133, Marcel Dekker Inc, ISBN 0-8247-7033-1.

Miracle, D.B. et al, ASM Handbook, vol. 21, Composites, Jan. 31, 2001, pp. 1079, Table 1, ASM International.

Non-final Office Action for U.S. Appl. No. 11/969,956 mailed Jul. 21, 2011, 12 pages.

Final Office Action for U.S. Appl. No. 11/969,956 mailed Dec. 13, 2011, 13 pages.

Non-final Office Action for U.S. Appl. No. 12/014,191 (now US patent 8,011,074) mailed Oct. 19, 2010, 8 pages.

International Search Report for PCT/US2008/050627 mailed May 30, 2008, 3 pages.

Final Office Action for U.S. Appl. No. 11/969,956 mailed Aug. 17, 2012, 9 pages.

Notice of Allowance for U.S. Appl. No. 11/969,956 mailed Mar. 14, 2013, 9 pages.

* cited by examiner

LAYER ACOUSTIC WAVE DEVICE AND METHOD OF MAKING THE SAME

This application is a Divisional of U.S. utility application Ser. No. 11/418,909 filed May 5, 2006, U.S. Pat. No. 7,619,347 which claims the benefit of U.S. provisional patent application Ser. No. 60/684,015 filed May 24, 2005 and U.S. provisional patent application Ser. No. 60/687,822 filed Jun. 6, 2005.

FIELD OF THE INVENTION

The present invention relates to electronic components, and in particular to an improved layer acoustic wave device and a method for making the same.

BACKGROUND OF THE INVENTION

Surface acoustic wave (SAW) devices are often used in filtering applications for high frequency signals. Given the inherent bulk and expense associated with SAW devices, efforts have been made to minimize the size and expense associated with the often-used devices.

SAW devices take advantage of elastic, or acoustic, waves that travel along an open and solid surface and through a vacuum or gas. Generally, a piezoelectric substrate provides the open and solid surface over which the elastic waves will propagate. The elastic waves are created upon exciting an interdigital transducer (IDT) by electrical signals, wherein in a two-port device the waves may be reciprocally received by another IDT. To maintain a free space on the surface of the piezoelectric substrate, the packages for SAW devices require a cavity. Creating a cavity in these SAW devices results in a component that is bulky and expensive to manufacture.

To address some of the issues with SAW devices, layer acoustic wave devices are proposed. Layer acoustic wave devices take advantage of elastic waves that travel in a layer confined by two surrounding mediums of different properties. With layer acoustic wave devices, the elastic wave need not travel along an open surface.

U.S. patent application number 2005/0099091 A1 to Mishima, entitled ELASTIC BOUNDARY WAVE DEVICE AND METHOD OF MANUFACTURING THE SAME (hereinafter "Mishima"), illustrates recent advances in devices with similar types of waves. Mishima creates a boundary wave device by assembling a first substrate with a first dielectric film, which covers IDTs that are formed on the first substrate. A second substrate is separately assembled, and includes a second dielectric film. The second substrate is then inverted and bonded together using a bonding process to form a junction between the first and second dielectric films. The second substrate is required in order to form a proper type of wave and to minimize leakage of the elastic wave to an outside surface of the resulting boundary wave device. Such leakage can interfere with other components and make the device less efficient. Although the suggestion by Mishima is an improvement over traditional SAW devices, the need to create different substrates and then bond the substrates together adds additional complexity and expense to the manufacturing process.

Accordingly, there is a need for an effective boundary wave device that can be efficiently manufactured. There is a further need to minimize the leakage of the elastic boundary waves to an outside surface of the resulting boundary wave device while avoiding the need to create separate substrates and employ bonding techniques to create the boundary wave device.

SUMMARY OF THE INVENTION

In the boundary wave approach proposed by Mishima, the elastic wave propagates at the boundary of two, for all practical purposes, infinitely thick substrates that are bonded together. The present invention provides a layer acoustic wave device that is formed without requiring a bonding process to attach a secondary substrate. In particular, the layer acoustic wave device is formed from a substrate, at least one interdigital transducer with or without reflecting gratings created on the substrate, a dielectric layer formed over the interdigital transducer and substrate, and at least one isolation layer formed over the dielectric layer. The at least one isolation layer has sufficient properties to minimize particle displacement on the top surface of the at least one isolation layer. The at least one isolation layer has a greater acoustic impedance than that of the dielectric layer. Different types of polarized waves may exist in the substrates and layers or their combinations, for example, Shear Horizontal (SH) waves, Shear Vertical (SV) waves, Longitudinal (L) waves, and Rayleigh waves. All these waves from now onwards are referred to as 'acoustic wave' in the generic sense. Examples may be given for SH wave type, but, it should be understood that the operation principles, embodiments, and claims are applicable for all wave types relevant to particular substrate and layer combinations. The acoustic impedance term is related to the acoustic impedance in each corresponding type or polarization of waves in relevant propagation directions that are interacting in each particular combination of materials.

In a first embodiment, the first isolation layer formed over the dielectric layer has an acoustic impedance greater than that of the dielectric layer. Further, the acoustic wave velocity of the first isolation layer is greater than that of the dielectric layer. In a second embodiment, the first isolation layer has an acoustic impedance greater than that of the dielectric layer, but the acoustic wave velocity of the isolation layer is less than that of the dielectric layer.

In a third embodiment, multiple isolation layers are deposited over the dielectric layer. Each of the isolation layers will have an acoustic impedance greater than that of the dielectric layer. Further, the acoustic wave velocities of these layers may alternate from one layer to the next with respect to one another, and with respect to the acoustic wave velocity of the dielectric layer. For example, every other layer may have an acoustic wave velocity that is less than that of the dielectric layer, wherein the remaining isolation layers may have an acoustic wave velocity that is greater than that of the dielectric layer. Depending on the embodiment, the acoustic wave velocity of the first isolation layer may be greater or less than that of the dielectric layer.

In a fourth embodiment, many isolation layers are deposited over the dielectric layer. The acoustic impedances of the layers will vary from one layer to the next, and will generally alternate from one relative acoustic impedance to another. For example, the first isolation layer may have an acoustic impedance greater than that of the dielectric layer. The second isolation layer may have an acoustic impedance the same as or less than that of the dielectric layer. The third isolation layer may have an acoustic impedance greater than that of the dielectric layer, and perhaps the same as that of the first isolation layer, and so forth. Further, the relative acoustic wave velocities of the various isolation layers may alternate between relatively low and relatively high values. In all the above four embodiments, in each layer, the acoustic impedance may be additionally graded by changing the composition or growth condition of the layer or by introducing different materials with similar acoustic properties.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
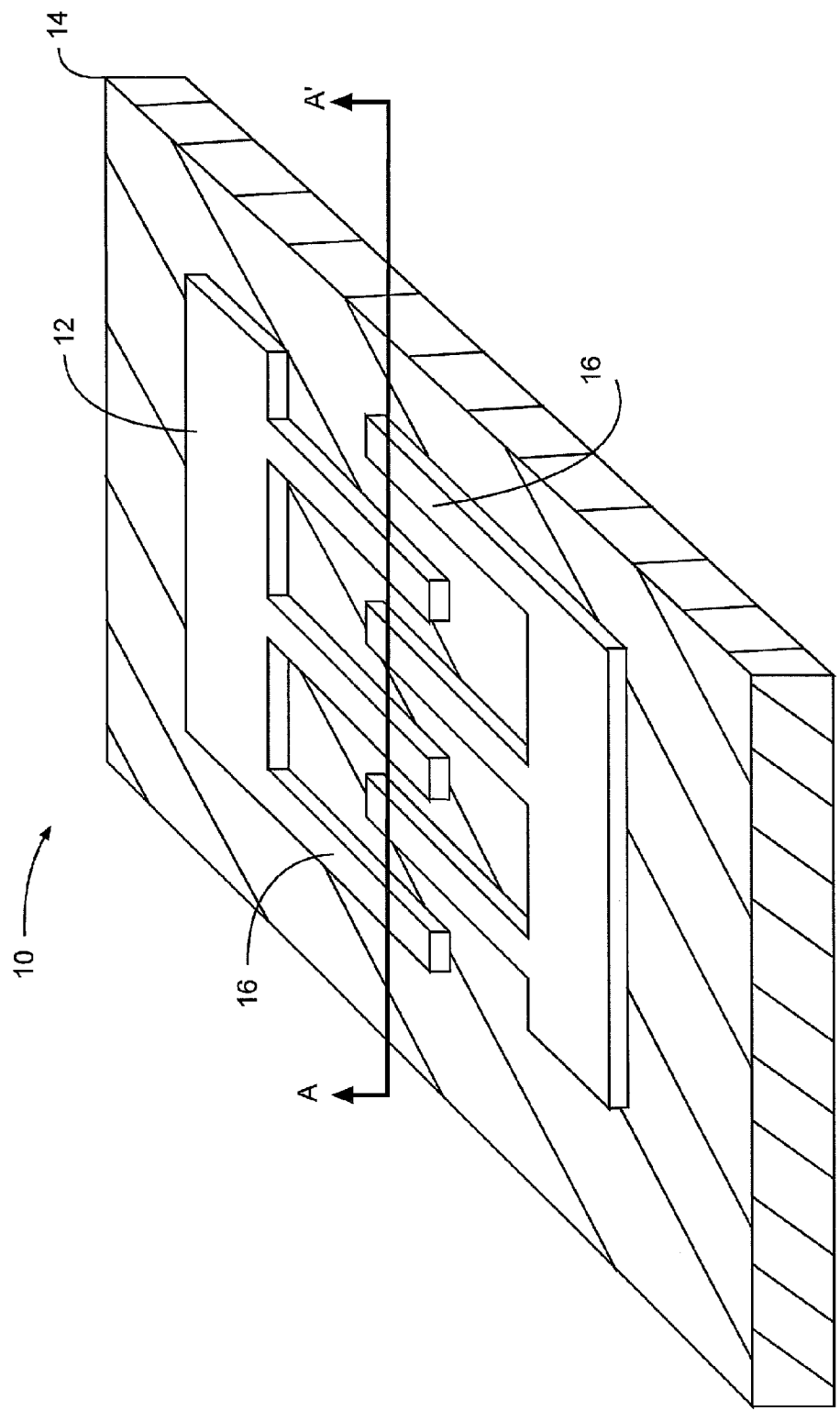
FIG. 1 illustrates a portion of a layer acoustic wave device according to one embodiment of the present invention.

With reference to FIG. 1, a lower portion of a layer acoustic wave device is illustrated as including an interdigital transducer (IDT) 12, which is mounted on a solid surface of a piezoelectric substrate 14. The piezoelectric substrate 14 is a substrate having a high acoustic impedance, such as lithium tantalate ($LiTaO_3$). Other examples include lithium niobate, quartz, langasite, langanate, langatate, lithium tetraborate, thin film piezoelectric substrates, and the like. As illustrated, the comb-like electrodes 16 of the IDT 12 overlap one another along the top surface of the piezoelectric substrate 14, yet do not touch one another. In operation, an electrical signal is applied to the IDT 12 to excite an acoustic wave along the surface of the piezoelectric substrate 14. The piezoelectric substrate may be a crystalline substrate or a substrate having a piezoelectric layer of film upon which the IDTs 12 are formed.

Figure 2:
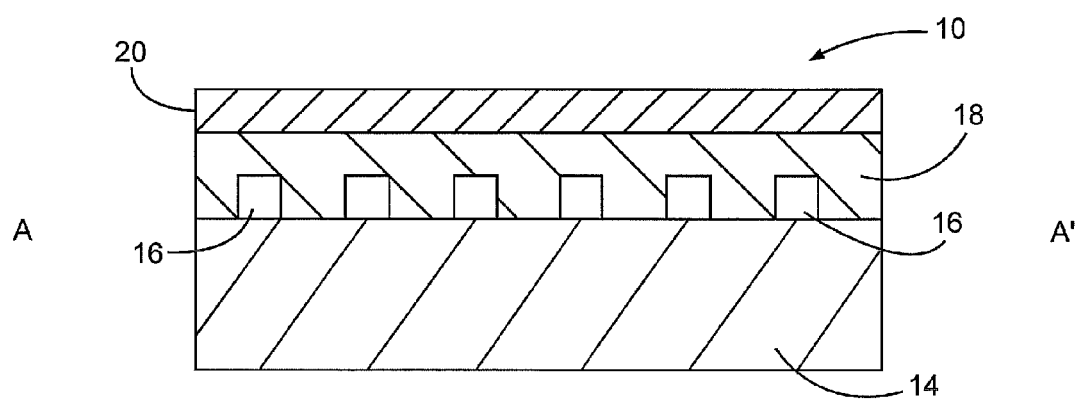
FIG. 2 illustrates a layer acoustic wave device according to a first embodiment of the present invention.

Turning now to FIG. 2, a cross-section of a layer acoustic wave device 10 is illustrated according to one embodiment of the present invention. The embodiment of FIG. 2 builds upon the structure illustrated in FIG. 1, and the cross-section is along line A-A'. As such, the electrodes 16 of the IDT 12 are shown on a top surface of the substrate 14. The IDT 12 may be formed by depositing a metallic layer upon the upper surface of the substrate 14 with or without intermediate dielectric or piezoelectric layers in between, and then etching or otherwise removing the excess portions of the metallic layer, such that the remaining portions of the metallic layer represent the desired IDT 12.

For the present invention, a dielectric layer 18 is then deposited over the IDT 12 (electrodes 16) on the top surface of the substrate 14. The dielectric layer 18 is an electrically non-conducting material through which acoustic waves may readily propagate. For example, the dielectric layer 18 may be silicon dioxide ($SiO_2$), tellurium oxide ($TeO_2$) or other materials which may or may not have temperature compensation properties for the whole device. In special cases, the dielectric material may also have piezoelectric nature. The combined shear horizontal wave velocity in the metal and dielectric layers is lower than that in the substrate 14 and in case of need, lower than the lowest quasi-shear wave velocity in the substrate 14.

An isolation layer 20 is deposited using an appropriate deposition technique on the dielectric layer 18. The composition of the isolation layer 20 is selected to maintain the energy of the acoustic layer wave mainly confined in the dielectric layer 18, in the vicinity of the electrodes 16, and the region of the piezoelectric substrate 14 close to the electrodes 16. In particular, the present invention strives to minimize particle displacement caused by the presence of an acoustic layer wave in the substrate 14 and the dielectric layer 18, along the top surface of the isolation layer 20. In essence, the present invention provides a high acoustic impedance isolation layer 20 deposited on the dielectric layer 18, instead of having to use a mechanical bonding process to attach another substrate along the top surface of the dielectric layer 18.

As such, the isolation layer 20 will have a relatively high acoustic impedance, and will preferably have an acoustic impedance that is greater than the acoustic impedance of the dielectric layer 18. As an example, the ratio of the acoustic impedance of the isolation layer 20 to the acoustic impedance layer of the dielectric layer 18 may range from 1.5 to 40. In one embodiment of the present invention, the isolation layer 20 has a higher shear horizontal wave velocity than the dielectric layer 18. As an example, the shear horizontal wave velocity of the isolation layer 20 may range from 1.1 to 10 times the corresponding velocity of the dielectric layer, wherein the combined shear horizontal wave velocity of the dielectric layer 18 and of the metal layer used to form the electrodes 16 may range from 0.1 to 0.95 of the corresponding velocity in the substrate 14. In such an embodiment, the isolation layer 20 may be formed from alumina (amorphous $Al_2O_3$), sapphire (crystalline $Al_2O_3$), silicon nitride ($Si_3N_4$), or hard diamond-like film, if the dielectric layer is $SiO_2$. If the dielectric layer 18 is other than $SiO_2$ then the choice of materials becomes even wider.

In an alternate embodiment, the shear horizontal wave (for example) velocity of the isolation layer 20 is less than the shear horizontal wave velocity of the dielectric layer 18. As such, the shear horizontal wave velocity of the isolation layer 20 may range from 0.1 to 0.99 times the corresponding shear horizontal wave velocity of the dielectric layer 18, wherein the combined shear horizontal wave velocity of the dielectric layer 18 and of the metal layer used to form the electrodes 16 may range from 0.1 to 0.95 of the corresponding shear horizontal velocity in the substrate 14. To provide a relatively high acoustic impedance and a relatively low shear horizontal wave velocity, the isolation layer 20 may be formed with but not limited to tungsten (W) and its oxides, platinum (Pt), hafnium oxide ($HfO_2$), tellurium dioxide ($TeO_2$), ytterbium oxide ($Yb_2O_3$), lutetium (Lu) oxide, tantalum (Ta) and Ta based oxides, gold (Au), palladium (Pd), osmium (Os), iridium (Ir), or rhenium (Rh) or combination of them either as chemical composition or layer sequences. Fluorides, borides, carbides, nitrides, and other chemical compositions with required acoustical properties can also be used. With the present invention, the extent to which the elastic boundary wave will extend into or through the isolation layer 20 is significantly minimized, wherein particle displacement along the top surface of the isolation layer 20 is negligible.

Figure 3:
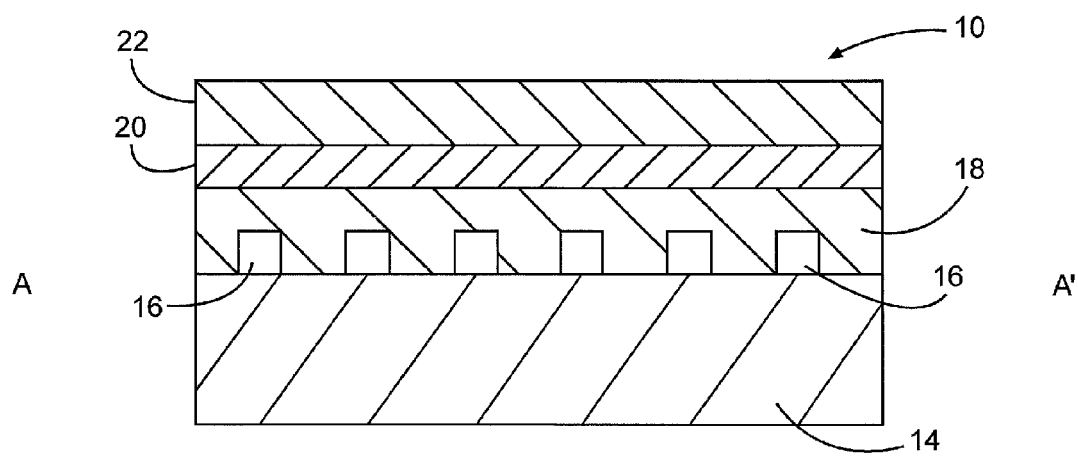
FIG. 3 illustrates a layer acoustic wave device according to a second embodiment of the present invention.

With reference to FIG. 3, another embodiment of the present invention is shown, wherein a second isolation layer 22 is deposited using an appropriate deposition process on the first isolation layer 20. In this embodiment, both of the first and second isolation layers 20 and 22 have a higher acoustic impedance than the dielectric layer 18; however, the first and second isolation layers 20 and 22 may have significantly different acoustic wave velocities. For example, the second isolation layer 22 may have a shear horizontal wave velocity that is greater than that of the dielectric layer 18, wherein the first isolation layer 20 will have a shear horizontal wave velocity that is less than that of the dielectric layer 18. The converse is equally applicable. Further, additional isolation layers may be added, wherein relatively fast and relatively slow isolation layers are alternated throughout two or more layers. The result of alternating isolation layers that have relatively slower and faster shear horizontal wave velocities is further isolation of the energy associated with the elastic boundary wave along the top surface of the uppermost isolation layer. Again, each of the isolation layers is deposited on top of one another or the dielectric layer 18, such that the use of a separate substrate and mechanical bonding process to attach the substrate to the dielectric layer 18 is avoided.

Figure 4:
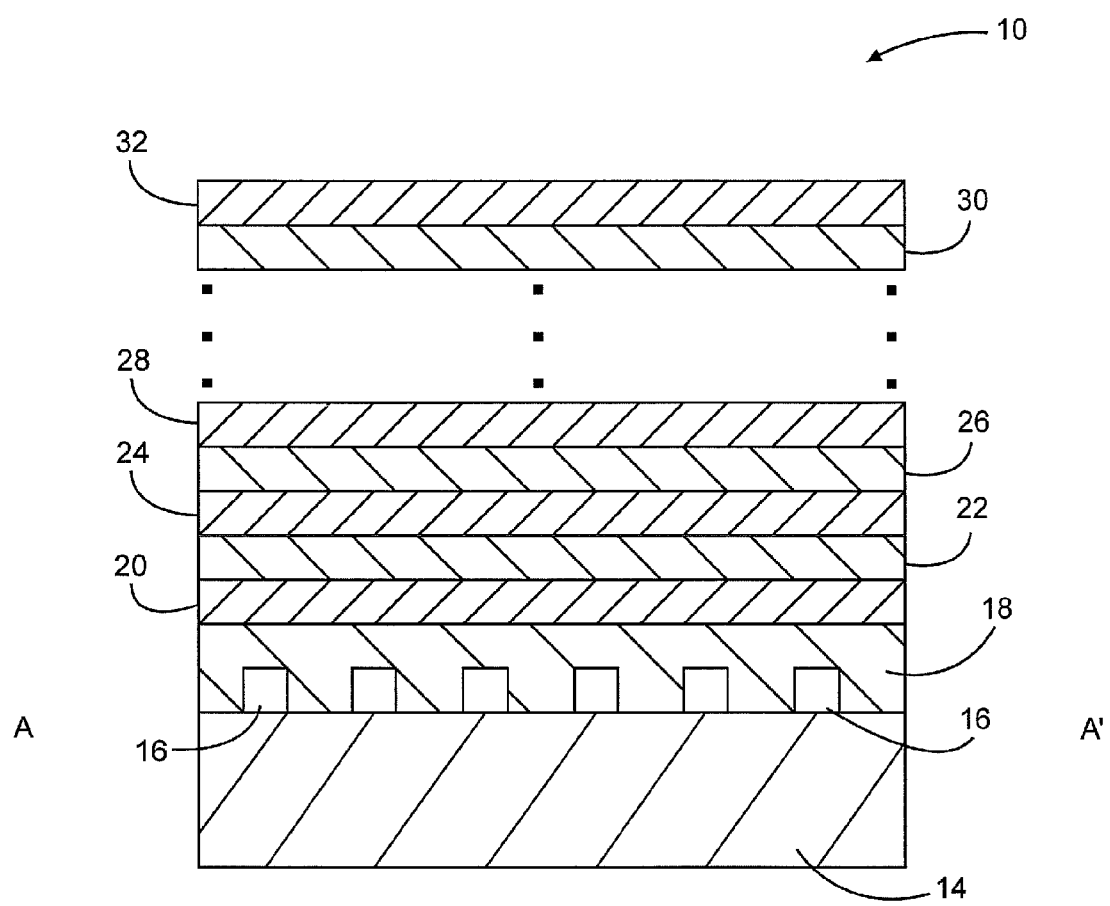
FIG. 4 illustrates a layer acoustic wave device according to a third and a fourth embodiment of the present invention.

Turning now to FIG. 4, yet another embodiment of the present invention is illustrated, wherein many isolation layers are layered upon one another over the dielectric layer 18. In particular, isolation layers 20, 22, 24, 26, 28, 30, and 32 are illustrated, wherein further intermediate isolation layers may be provided. Throughout the isolation layers 20-32, materials are used such that the acoustic impedance of the isolation layers 20-32 alternate between relatively high and low acoustic impedances. The relative acoustic impedances may alternate with respect to one another within the isolation layers 20-32, or with respect to the dielectric layer 18. For example, the first isolation layer 20 may have an acoustic impedance that is greater than the acoustic impedance of the dielectric layer 18. The second isolation layer 22 may have an acoustic impedance that is the same or less than that of the dielectric layer 18. The third isolation layer 24 may have an acoustic impedance identical to that of the first isolation layer 20, and the fourth isolation layer 26 may have an acoustic impedance identical to that of the second isolation layer 22, and so forth in an alternating fashion. Notably, the second and fourth isolation layers 22 and 26 may be made of the same material as the dielectric layer 18, such that their acoustic impedances are the same. Alternatively, the second and fourth isolation layers 22, 26 (and so on) may be formed from a material having an acoustic impedance less than that of the dielectric layer 18.

In one embodiment, the isolation layers may alternate between high density and low density metal layers, which correspond to high and low acoustic impedance layers. Exemplary high density metals are platinum (Pt), gold (Au) and tungsten (W), wherein exemplary low density metals are aluminum (Al), beryllium (Be) and magnesium (Mg).

Regardless of the embodiment, the isolation layer 20 and any additional isolation layers 22, etc., will have a combined thickness of preferably less than ten times the wavelength of the center frequency associated with the layer acoustic wave. In a preferred embodiment, the total thickness of the one or more isolation layers is less than five times the wavelength at the center frequency of the layer acoustic wave, and may even be less than the wavelength at the center frequency of the layer acoustic wave.

Figure 5:
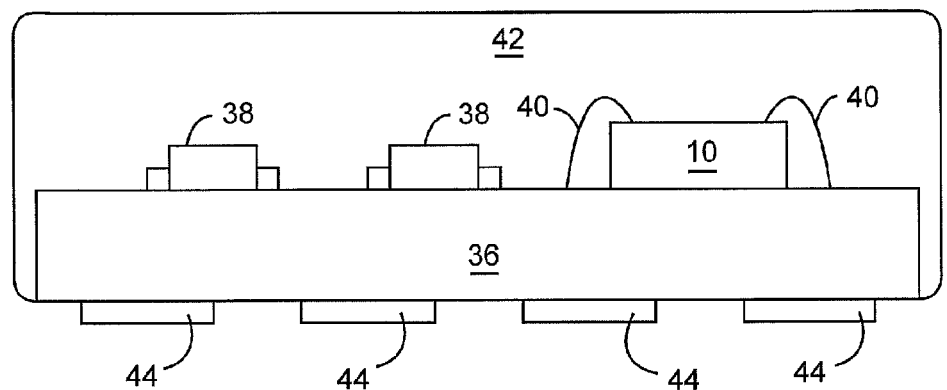
FIG. 5 illustrates the layer acoustic wave device of the present invention being mounted in a module using wire bonding.

Turning now to FIG. 5, a first embodiment of a semiconductor module 34 is illustrated wherein the layer acoustic wave device 10 is shown mounted on a printed circuit board laminate 36, along with other surface mount devices 38. Once the layer acoustic wave device 10 and any other surface mount devices 38 have been mounted to the printed circuit board laminate 36, a molding compound 42 may be applied over the printed circuit board laminate 36 as well as the surface mount devices 38 and the layer acoustic wave device 10 to form the semiconductor module 34. In this embodiment, the bottom of the layer acoustic wave device 10 is mounted on a top surface of the printed circuit board laminate 36. Electrical connections from the IDT 12 to the printed circuit board are provided via wire bonds 40. Although not specifically depicted, the wire bonds 40 will be electrically connected to the IDTs 12 through the isolation layers 20, etc., and through to the dielectric layer 18 through any available techniques. Bond pads 44 are provided on the bottom of the printed circuit board laminate 36, and thus the bottom of the module 34, to facilitate electrical connection to other substrates, printed circuit board laminates, or the like.

Figure 6:
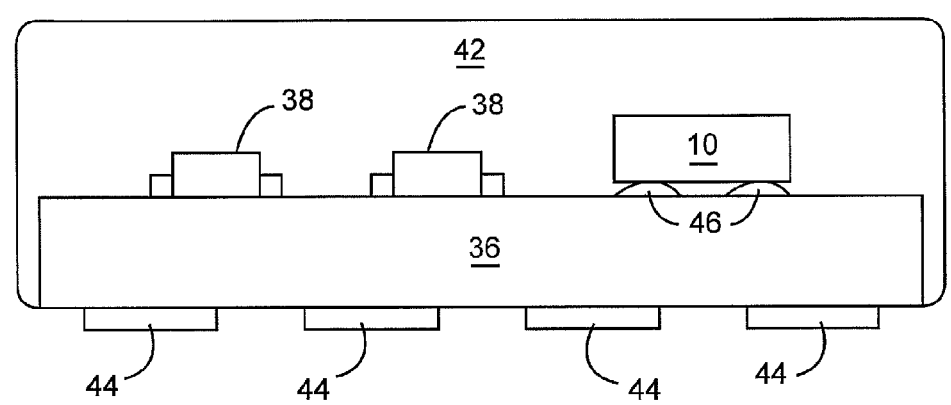
FIG. 6 illustrates the layer acoustic wave device of the present invention being mounted in a module using flip chip technology.

With reference to FIG. 6, another embodiment of a semiconductor module is provided, wherein the boundary wave device 10 is mounted on the top surface of the printed circuit board laminate 36 using flip chip technology. In essence, the boundary wave device 10 is inverted, electrically coupled to, and mechanically mounted to the upper surface of the printed circuit board laminate 36 via solder bumps 46. Again, various techniques are available to those skilled in the art to effectively couple the IDTs 12 to the solder bumps 46.

With either of the embodiments in FIG. 5 and FIG. 6, the isolation layers 20, etc. of the layer acoustic device 10 eliminate the need for encapsulations or substrates, which require bonding techniques during the formation of the boundary wave device as described by Mishima. Further, additional shielding is not required, and as such, the molding process may take place after the layer acoustic wave device 10 and any other surface mount devices 38 are mounted to the top or bottom surfaces of the printed circuit board laminate 36, or other mounting structure, such as a ceramic substrate or semiconductor crystal.

Those skilled in the art will recognize improvements and modifications to the preferred embodiments of the present invention. All such improvements and modifications are considered within the scope of the concepts disclosed herein and the claims that follow.

What is claimed is:

1. A method of forming a layer acoustic wave device comprising:
   providing a piezoelectric substrate having an upper surface;
   forming a metallic interdigital transducer on the upper surface of the piezoelectric substrate;
   creating a dielectric layer having a first acoustic impedance and formed over the upper surface of the piezoelectric substrate and the metallic interdigital transducer;
   depositing or growing a first isolation layer having a second acoustic impedance over the dielectric layer, the second acoustic impedance being greater than the first acoustic impedance, wherein the first isolation layer is configured to confine acoustic energy in the dielectric layer;

depositing or growing a second isolation layer having a third acoustic impedance over the first isolation layer; and depositing or growing a third isolation layer having a fourth acoustic impedance over the second isolation layer, the fourth acoustic impedance being greater than the third acoustic impedance.

2. The method of claim 1 wherein an acoustic wave velocity of the first isolation layer is greater than an acoustic wave velocity of the dielectric layer.

3. The method of claim 1 wherein an acoustic wave velocity of the first isolation layer is less than an acoustic wave velocity of the dielectric layer.

4. The method of claim 1, wherein the third acoustic impedance is greater than the first acoustic impedance, and wherein an acoustic wave velocity of the first isolation layer is greater than an acoustic wave velocity of the dielectric layer, and an acoustic wave velocity of the second isolation layer is less than the acoustic wave velocity of the dielectric layer.

5. The method of claim 1 further comprising depositing or growing a plurality of isolation layers disposed above the third isolation layer, over the dielectric layer, wherein the plurality of isolation layers alternate between having an acoustic impedance greater than the first acoustic impedance and having an acoustic impedance less than the first acoustic impedance.

6. The method of claim 1 wherein there are no substrates bonded to an upper surface of the piezoelectric substrate.

7. The method of claim 1 wherein all layers formed over the dielectric layer are formed using deposition or growth techniques.

8. The method of claim 1 wherein the second acoustic impedance is at least 1.5 times the first acoustic impedance.

9. The method of claim 1 wherein the third acoustic impedance is less than second acoustic impedance and the fourth acoustic impedance.

10. The method of claim 1 wherein the third acoustic impedance is about equal to the first acoustic impedance.

11. The method of claim 1 wherein the first isolation layer is in direct contact with the dielectric layer, the second isolation layer is in direct contact with the first isolation layer, and the third isolation layer is in direct contact with the second isolation layer.

12. The method of claim 1 wherein the first isolation layer is in direct contact with the dielectric layer.

13. The method of claim 1 wherein the second isolation layer is in direct contact with the first isolation layer.

14. The method of claim 1 wherein the third isolation layer is in direct contact with the second isolation layer.

15. A method of forming a layer acoustic wave device comprising:

providing a piezoelectric substrate having an upper surface;

forming a metallic interdigital transducer on the upper surface of the piezoelectric substrate;

creating a dielectric layer having a first acoustic impedance and formed over the upper surface of the piezoelectric substrate and the metallic interdigital transducer;

depositing or growing a first isolation layer having a second acoustic impedance over the dielectric layer, the second acoustic impedance being greater than the first acoustic impedance, wherein the first isolation layer is configured to confine acoustic energy in the dielectric layer;

depositing or growing a second isolation layer having a third acoustic impedance over the first isolation layer;

depositing or growing a third isolation layer having a fourth acoustic impedance over the second isolation layer, the fourth acoustic impedance being greater than the third acoustic impedance;

depositing or growing a fourth isolation layer having a fifth acoustic impedance over the third isolation layer; and depositing or growing a fifth isolation layer having a sixth acoustic impedance over the fourth isolation layer, and wherein the sixth, fourth, and second acoustic impedances are substantially equal, and wherein the fifth and third acoustic impedances are substantially equal.

* * * * *